United States Patent [19]  [11] Patent Number: 4,938,280
Clark  [45] Date of Patent: Jul. 3, 1990

[54] LIQUID-COOLED, FLAT PLATE HEAT EXCHANGER

[76] Inventor: William E. Clark, 401 Hyder St., N.E., Palm Bay, Fla. 32907

[21] Appl. No.: 268,068

[22] Filed: Nov. 7, 1988

[51] Int. Cl.⁵ ............................................. F28F 7/00
[52] U.S. Cl. .................... 165/80.4; 29/890.05
[58] Field of Search ............... 165/80.4; 29/151.3 R; 264/317, 221; 164/132

[56] References Cited

U.S. PATENT DOCUMENTS

| | | | |
|---|---|---|---|
| 3,327,776 | 6/1907 | Butt | 165/80.4 |
| 4,151,548 | 4/1979 | Klein | 165/80.4 X |
| 4,440,392 | 4/1984 | Popplewell | 264/317 X |
| 4,781,244 | 11/1988 | Kuramitsu | 165/80.4 |
| 4,794,981 | 11/1989 | Mizuno | 165/80.4 |

Primary Examiner—Alan Cohan
Attorney, Agent, or Firm—Julian C. Renfro

[57] ABSTRACT

A one-piece, substantially flat and very thin heat exchanger core in accordance with this invention has two flat and parallel surfaces, with each of said surfaces being suitable as a mounting surface for a number of heat producing electronic chips. These surfaces are closely spaced and separated by a single cavity for conveying a fluid coolant, and the cavity contains a plurality of closely spaced pins extending the full distance between the parallel surfaces. The pins are formed and permanently joined to both of the parallel surfaces, and quite significantly, this is accomplished with creation of a seam. Each pin is capable of having a hole installed through for its entire length, from one of the flat surfaces to the other, without breaching the fluid cavity and without creating a path for fluid to leak from the fluid cavity to the ambient. Also significant is the novel method by which this heat exchanger is constructed.

11 Claims, 7 Drawing Sheets

LIQUID-COOLED, FLAT PLATE HEAT EXCHANGER

FIELD OF THE INVENTION

This invention relates to a flat plate heat exchanger for transferring heat to or from a device or number of devices attached to its surfaces, and in order to fully reveal its many advantages, this invention is described herein as it relates to cooling an array of semiconductor circuit chips

BACKGROUND OF THE INVENTION

Advances in semiconductor processing and circuit design have led to increased component density in very large scale integrated (VLSI) circuit arrays. While the individual components comprising such circuits operate at low voltage and draw very low currents, the increased density of the components in such circuits has a consequential increase in heat generated per unit area of semiconductor chip surface. This has necessitated the use of heat conducting pedestals and heat exchangers attached to the chips to facilitate the removal of heat from the chip surface. An overview of state of the art heat removal is contained in the article "High Heat from a Small Package" appearing in the March 1986 edition of "Mechanical Engineering."

Heretofore, a variety of heat exchangers have been suggested as a means for mounting semiconductor devices and additionally serving as the means for transferring the chip heat to a flowing gas or liquid coolant. Examples of such prior art include the Jackson U.S. Pat. No. 2,942,165, the Butt U.S. Pat. No. 3,327,776, the Laermer U.S. Pat. No. 3,706,010, the Klein U.S. Pat. No. 4,151,548, the Pellant U.S. Pat. No. 4,188,996, and others.

A common difficulty with devices of the prior art is their construction which typically does not allow a reliable means for electrical leads and fasteners to pass through the thickness of the fluid passage. Additionally, devices of the prior art are susceptible to fluid leakage due to eventual failure of joints or seams which have been bonded or soldered to prevent fluid leakage to the environment Such failures are likely when the device is operated in a high vibration environment or when the pressure of the working fluid is high. Finally, devices of the prior art are limited to substantially thick cross sections due to the methods of fabrication taught by their inventors. Such thick cross sections impose undesirable weight and space penalties in electronic systems, especially those found in high speed computers and airborne electronic equipment.

With regard to the S. P. Jackson et al U.S. Pat. No. 2,942,165 entitled "Liquid Cooled Current Rectifiers," it is to be noted that Jackson's pin arrays are discrete pin clusters which can be inserted and removed from the fluid passage. The pin fins in the Jackson device are not integral with the walls of the heat exchanger, and most importantly, the Jackson heat exchanger cannot be drilled through its cross section without breaching the fluid cavity and causing a leak. The Jackson device certainly does not teach a seamless heat exchanger having a very thin cross section, as in the instant invention, nor does Jackson teach inlet and outlet tubes integral with the finned core of the heat exchanger.

The A. G. Butt U.S. Pat. No. 3,327,776 entitled "Heat Exchanger" is constructed from a number of individually fabricated parts, including fins, top, bottom, end plates and mounting columns and the like, and it quite obviously contains many joints and seams requiring effective means for sealing against fluid leaks. The Butt device is of the class of devices sought to be improved upon by the present invention, where no sealing techniques are needed in view of its freedom from seams and joints.

The Haumesser et al U.S. Pat. No. 3,328,642 is concerned with the cooling of electronics by the use of meltable material, such as sodium. Although at a selected temperature the material in the reservoir melts and absorbs large quantities of heat, after all the material has melted, the temperature of the reservoir and the liquid increases, with the temperature of the electronic components likewise increasing until such ti me as the electronics fail. It is therefore to be seen that the Haumesser et al patent relates to a device with which continuous operation is impossible.

The Chu et al U.S. Pat. No. 3,524,497 involves the use of relatively large pins protruding into a fluid cavity from one wall, and quite importantly, those pins could not be drilled through without causing a fluid leak. The Chu et al arrangement is to be contrasted with the present invention, wherein seamless pins extend the full distance of the fluid cavity and are permanently joined to the two opposing walls, with no chance of leakage.

The Laermer et al U.S. Pat. No. 3,706,010 represents a heat exchanger formed from at least two separately machined parts joined together. Presumably the end walls and tubes conveying fluid to and from the core would also be attached by brazing or adhesives. That teaching is to be contrasted with the instant novel method and novel construction involving a single fluid passage taught herein, for the present novel heat exchanger is seamless in that it is formed as a single piece or component, thus not requiring the use of adhesives or brazing.

With regard to the Peck U.S. Pat. No. 3,971,435, it involves a totally enclosed transfer device or "heat pipe" containing a fixed amount of fluid which never passes beyond the boundaries of the device. Peck uses parallel grooves to convey the liquid coolant from one end of the heat pipe to the other, which grooves are covered with a perforated plate. The space above the perforated plate conveys the same coolant in its gaseous state. It is important to note that Peck's unit cannot accommodate electrical leads from any electronic device mounted directly to it, for any hole drilled in the Peck device would create fluid leakage and subsequent failure.

The Ruka et al U.S. Pat. No. 4,057,101 is somewhat similar to the previously mentioned Haumesser et al patent, as it features a totally sealed heat sink containing a meltable material in a honeycomb structure. It is important to note that, in steady state operation, the amount of heat removable in accordance with the Ruka et al teaching is quite limited inasmuch as the heat exchanger would be in poor thermal contact with the electronic devices. Obviously, this patent cannot be construed as representing a seamless device, or a device in which liquid may flow through it continuously as in the instant invention.

With reference to the Klein et al U.S. Pat. No. 4,151,548, it teaches a heat exchanger with a single fluid passage with multiple pins extending the height of the passage, with such pins being of a structure integral with the top and bottom walls. Significantly, Klein utilizes a two-piece construction wherein identical halves are soldered together, which of course is to be contrasted with the present invention, which utilizes a single component construction free of seams and therefore not requiring any soldering type efforts.

The Pellant et al U.S. Pat. No. 4,188,996 is a liquid cooled heat exchanger comprised of two separately fabricated parts, which are subsequently soldered or glued together, with separate tubes for conveying coolant to and from the heat exchanger being attached, presumably by soldering or glueing. Although it might be possible to drill holes through Pellant's device, such drilled holes would necessarily have to pass through a glued or soldered seam, thereby creating a potential for fluid leakage. This is to be contrasted with the present invention wherein there is virtually no chance of leakage of any kind With regard to the Frieser et al U.S. Pat. No. 4,312,012, this amounts to a technique for enhancing boiling heat transfer, and this is not really a heat exchanger device. Any electronic devices would need to be mounted inside the fluid cavity in accordance with the Frieser et al teaching, and no fluid flow can take place, which is to be contrasted with the instant invention, wherein a substantial amount of cooling takes place as a result of the flow of a coolant fluid. A further distinction of the instant invention is that it necessitates none of the external fins employed by Frieser et al.

The Parmerlee et al U.S. Pat. No. 4,315,300 teaches the utilization of a plurality of printed circuit boards in a parallel relationship between two side plates, with the side plates containing a fluid passage for conveying liquid coolant from the printed circuit boards. Many distinctions are apparent here, for Parmerlee utilizes forced air over the electronic components to obtain partial cooling, whereas the instant invention does not rely on air or any other gas for cooling.

Concerning the Tuckerman et al U.S. Pat. No. 4,450,472, it teaches the cooling of a single semiconductor integrated circuit utilizing a plurality of parallel and closely spaced rectangular channels of microscopic size etched onto one side of a silicon chip, with the integrated circuit being applied to the opposite side of the chip. Cooling liquid is forced through microchannels to cool the integrated circuit. This of course is a construction quite different than the present invention, wherein several chips may be mounted to a separate heat exchanger, rather than the single chip arrangement taught by this patentee.

Regarding the Pease et al U.S. Pat. No. 4,567,505, it is concerned with a method of attachment between a chip and a heat sink, wherein specially shaped microscopic grooves are formed in the heat sink. The mating surface must be flat and smooth, and a liquid place between the two surfaces partially fills the grooves and, by capillary action, causes a significant attractive force between the two mating surfaces. There obviously is no consequential similarity between the Pease et al patent and the instant invention, for the instant invention teaches a novel heat exchanger construction, whereas Pease is concerned with a method of attachment between a chip and a heat sink.

It was in an effort to overcome the many disadvantages of the prior art devices that the present invention was evolved.

SUMMARY OF THE INVENTION

This invention relates to a flat plate heat exchanger for transferring heat to or from a device or number of devices attached to its surfaces. This invention has many uses such as a refrigerant condenser or evaporator in water cooled heat pumps, or as a liquid subcooler in air-cooled refrigeration systems, or as a cold plate for electronic chassis, for example. In order to fully reveal its many advantages, this invention is described herein as it relates to cooling an array of semiconductor circuit chips.

As will be seen in greater detail hereinafter, my invention teaches a highly compact heat exchanger device which is very convenient for cooling an array of integrated circuit chips. The heat exchanger is very thin and substantially flat. Heat generating chips may be attached to either or both of its two principal faces. A single cavity for conveying a suitable coolant traverses the length and width of the device. The fluid cavity is interrupted with a large number of generally circular pins which, in cross section, extend the full height of the cavity. These pin fins, the walls of the heat exchanger, and the fluid manifolds are formed as a single integral part so that there is no assembly required nor are there any seams to be joined or sealed against fluid leakage. Advantageously, holes through the pin fins may serve as passages for electrical conductors and mechanical fasteners.

In accordance with this invention I have thus provided a one-piece, very thin, substantially flat heat exchanger core having two flat and parallel surfaces, each of said surfaces being suitable as a mounting surface for a number of heat producing electronic chips. These surfaces are closely spaced and separated by a single cavity for conveying a fluid coolant, and quite importantly, the cavity contains any number of solid circular, or oblong pins extending the full distance between the parallel surfaces.

Advantageously, the pins I use are formed and permanently joined to both of the parallel surfaces without the creation of a seam, with such joining being accomplished without gaskets, weldments, solders, fasteners, adhesives or other sealants. Significantly, the pins are capable of being drilled through without breaching the fluid cavity and without creating a path for fluid to leak from the fluid cavity to the ambient.

A number of options are available, such as the heat exchanger core being constructed of a metal selected from a number of appropriate metals, or alternatively, the heat exchanger core may be constructed of a plastic selected from a number of appropriate plastics.

It is thus a principal object of my invention to provide a compact, highly effective heat dissipating device having a low thermal resistance to a cooling medium, as well as a novel method for the ready production of same at low cost.

Another object is to provide a compact, heat dissipating device able to be manufactured at reasonable cost and having a cross section many times smaller than devices of the prior art.

It is still another object of my invention to provide a compact, one-piece, heat dissipating device being free of seams and the attending soldering, welding, or glueing required of multi-piece devices.

Yet another object of my invention is to provide a rigid and lightweight structural member for mounting an array of integrated circuit chips, such structural member being capable of high internal fluid pressures while easily facilitating electrical and mechanical access to said integrated circuit chips.

It is yet still another object of my invention to provide certain highly effective manufacturing procedures such that my heat dissipating devices can be produced at a reasonable cost.

DETAILED DESCRIPTION

Figure 1:
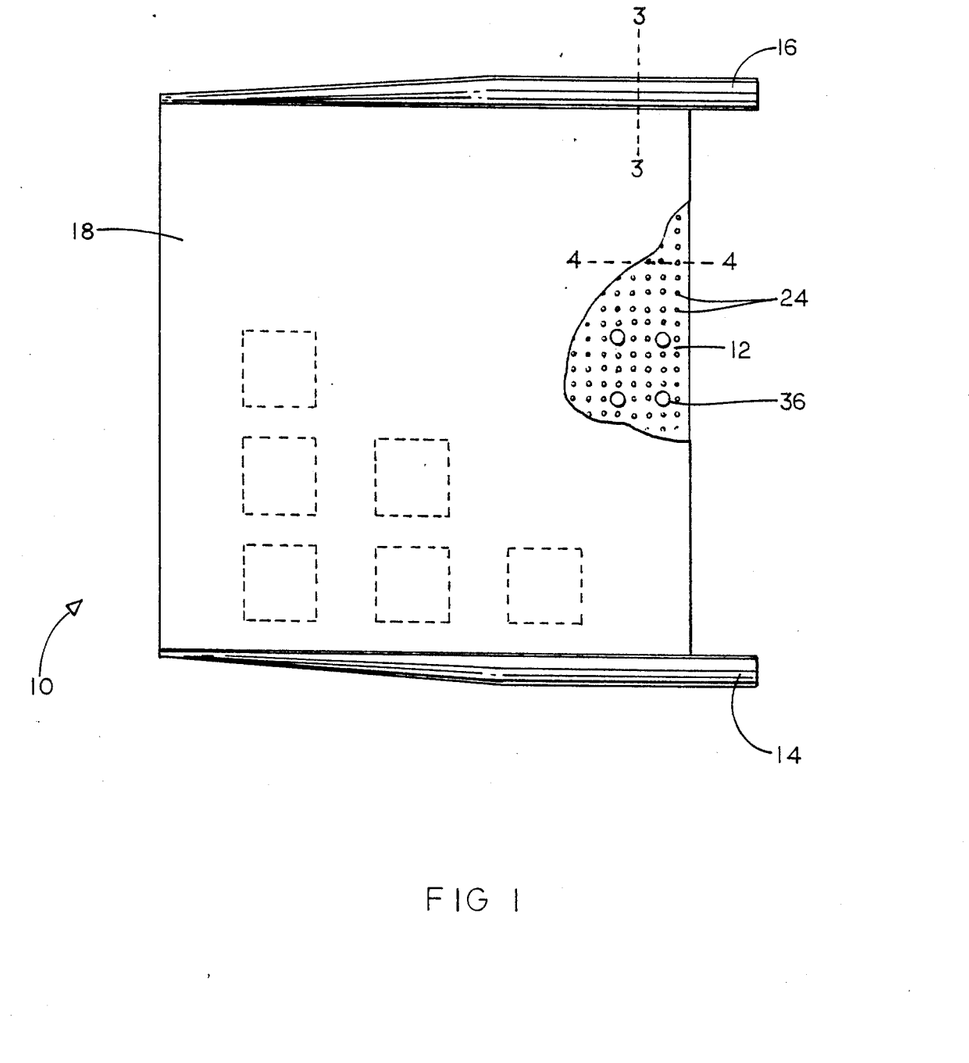
FIG. 1 is a top view of a preferred embodiment of my heat exchanger, with one portion broken away to reveal internal construction.
Figure 2:
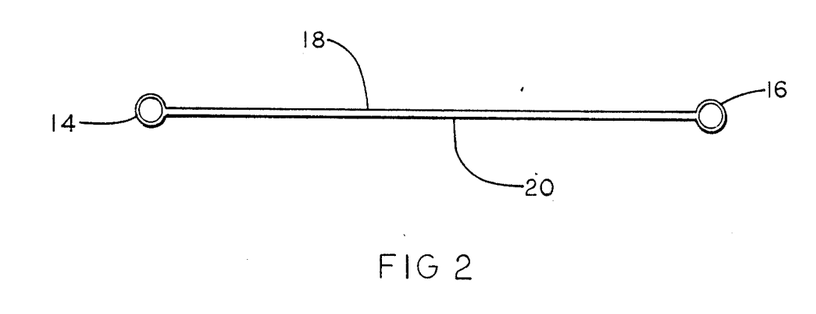
FIG. 2 is an edge view of the heat exchanger of FIG. 1.
Figure 3:
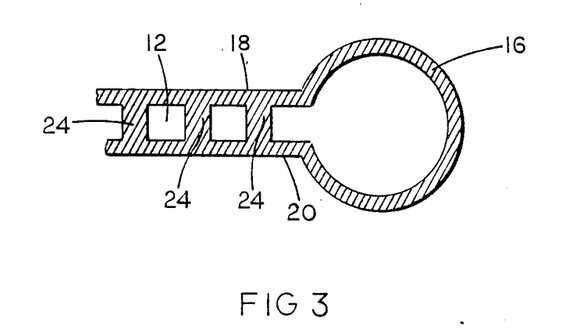
FIG. 3 is a substantially enlarged cross section taken at 3—3 in FIG. 1.

A preferred embodiment of a heat exchanger in accordance with FIGS. 1, 2 and 3 consists of a rectangular, plate-like structure, herein referred to as core 10, with a fluid passage 12 contained therein, and suitable manifold tubes 14 and 16 attached to the ends of the core. My heat exchanger has two major external surfaces, surfaces 18 and 20, which are substantially flat and parallel so that several heat generating devices, especially semiconductor integrated circuit chips, may be easily attached thereto. Surface 18 is visible in FIG. 1, and both major surfaces are shown in cross section in FIG. 2. Details as to preferred attachment means are described later.

Referring now to the cross section shown in FIG. 2, the core is revealed to be very thin, being only 0.040 to 0.120 inches thick overall. The core contains the single broad passage 12 through which fluid circulates, the passage 12 being generally centered between the two major external surfaces 18 and 20. It is to be understood that the fluid passage 12 is quite thin in cross section. Furthermore, it extends the full length of the core and, except for side wall thicknesses, the passage also extends the width of the core so that any coolant flowing in the fluid passage 12 comes into close thermal proximity to substantially all of the external mounting surface. Such distribution of the cooling fluid is highly advantageous, and quite beneficial for efficient heat transfer from the external mounting surface to the coolant. The coolant may for example, be water, or a phase changing fluid such as freon.

FIG. 3, a view taken along section 3—3 in FIG. 1, reveals to a considerably larger scale that the fluid passage 12 is interrupted with a large number of generally circular pins 24 which advantageously extend the full height of the passage. The outlet manifold 16 is to the right of the pins 24 in this figure. The pins in fluid cavity 12 may have any desired diameter but, for practical purposes, it is typical that the pin diameter will range from 0.010 inches to 0.120 inches. However, pins 24 shown in FIG. 1 and FIG. 3 are to be distinguished in size and quantity from large pins 36 also shown in FIG. 1. It is to be inferred from these figures that small pins 24 are closely spaced and constitute the majority of pins in fluid passage 12, such pins being no more than 0.035 inches in diameter. The function of small pins 24 and large pins 36 are revealed later in the description of FIGS. 5 and FIG. 6. Pins 24 and 36 may be located in any desired pattern within the fluid passage. For example, the pins may be arranged in a staggered pattern, or an in-line pattern, or a non-sequential arbitrary pattern, or a combination of several of the foregoing.

It is to be realized that the pins 24 create several significant benefits, one of which is substantially improved heat transfer, brought about because the pins are in highly effective contact with the coolant flowing in the fluid passage 12, and create substantial turbulence therein. Such turbulence prevents the formation and buildup of a fluid boundary layer which is known to hinder efficient heat transfer into fluids flowing in passages with heated surfaces. Additionally, the pins 24 are in excellent thermal contact with the external mounting surfaces, the only thermal resistance therebetween being the thermal conductivity of the material itself. Therefore, the pins are capable of transporting a significant quantity of heat away from the heated external surfaces and dissipating that heat into the coolant flowing through the fluid passage 12.

Further on the topic of efficient heat transfer, the fluid cavity in accordance with this invention consists of a single passage 12 having the same width as the core. I have found that the coolant is dispersed substantially uniformly throughout the width and length of the core, despite small local variations in the dimensions of the fluid passage. Such uniformity in fluid distribution manifests itself as efficient heat transfer without localized hot spots in the case of uniform heat loading at the mounting surface. For this reason, the single wide passage 12 is preferred over a prior art arrangement in which the passage consists of several channels or grooves in parallel.

It is therefore to be seen that a heat exchanger core constructed in accordance with my invention creates a very low thermal resistance between the heated external mounting surfaces and the flowing coolant. This low thermal resistance can be created without the need to pump large quantities of coolant through the core, as would otherwise be required for a fluid passage having a large cross-sectional area or smooth walls.

Figure 4:
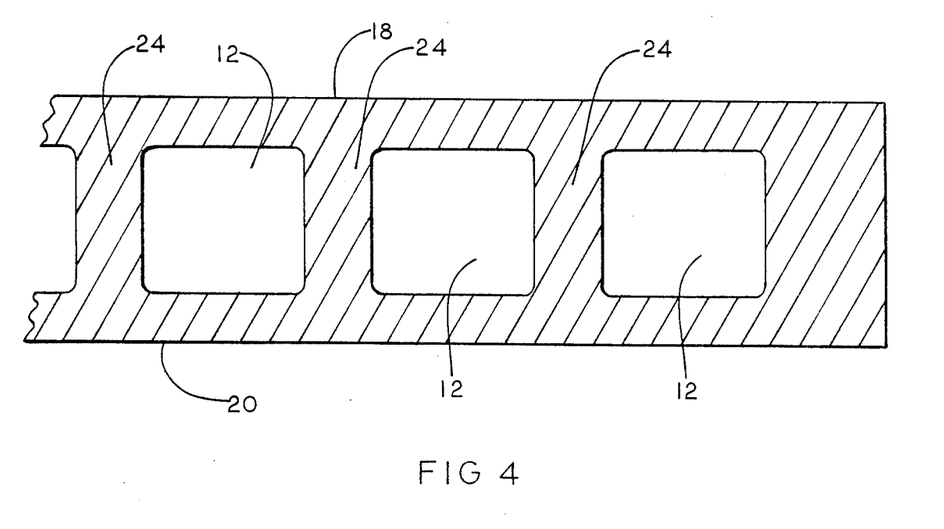
FIG. 4 is a greatly enlarged cross section of the heat exchanger taken at 4—4 in FIG. 1.

Referring again to FIG. 2 and related FIGS. 3 and 4, it will be seen from the large scale of FIG. 4 that the heat exchanger core is, quite advantageously, of one-piece construction. The four walls encasing the fluid passage and the pin fins 24 contained therein are appropriately formed of suitable material as an integral unit free of joints and seams. Consequently, there is no need for sealing or joining, which in known prior art devices is usually accomplished by means of soldering, welding, gasketing, gluing, or the like. In addition to being able, in accordance with this invention, to create a seamless heat exchanger core, it is also fully possible and highly desirable in accordance with this invention to fabricate the core with integral fluid manifolds also. That is, the core and manifolds may advantageously be formed as a single piece without seams or joints; note FIG. 3 in particular.

It is to be realized that the details of construction of my highly advantageous heat exchanger, and in particular its seamless nature and its fine and intricate internal profile, preclude utilization of the fabrication techniques taught in the prior art. For example, casting, brazing, welding, extrusion, etc. are techniques which cannot be used to construct the heat exchanger of the present invention. Rather, as will be seen hereinafter, I may fabricate my heat exchanger by first forming a shell over an expendable mandrel, then machining the shell to the desired external dimensions of the heat exchanger, and finally removing the mandrel by chemical means.

My novel heat exchanger is highly effective as a device to cool integrated circuit chips. For that purpose, I have devised effective means for mounting such chips to the heat exchanger in a reliable manner, and which facilitates high heat transfer from the chip, while also providing ways for easily connecting the chip leads.

Figure 5:
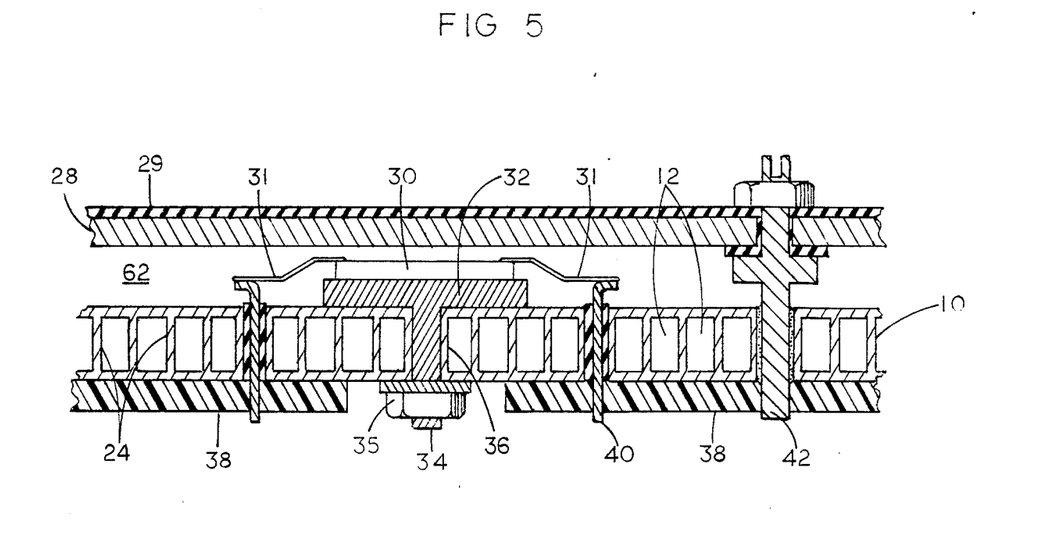
FIG. 5 is an enlarged cross section of a finished heat exchanger in accordance with my invention, showing one arrangement for mounting semiconductor chips and a metallized substrate or printed circuit board.
Figure 6:
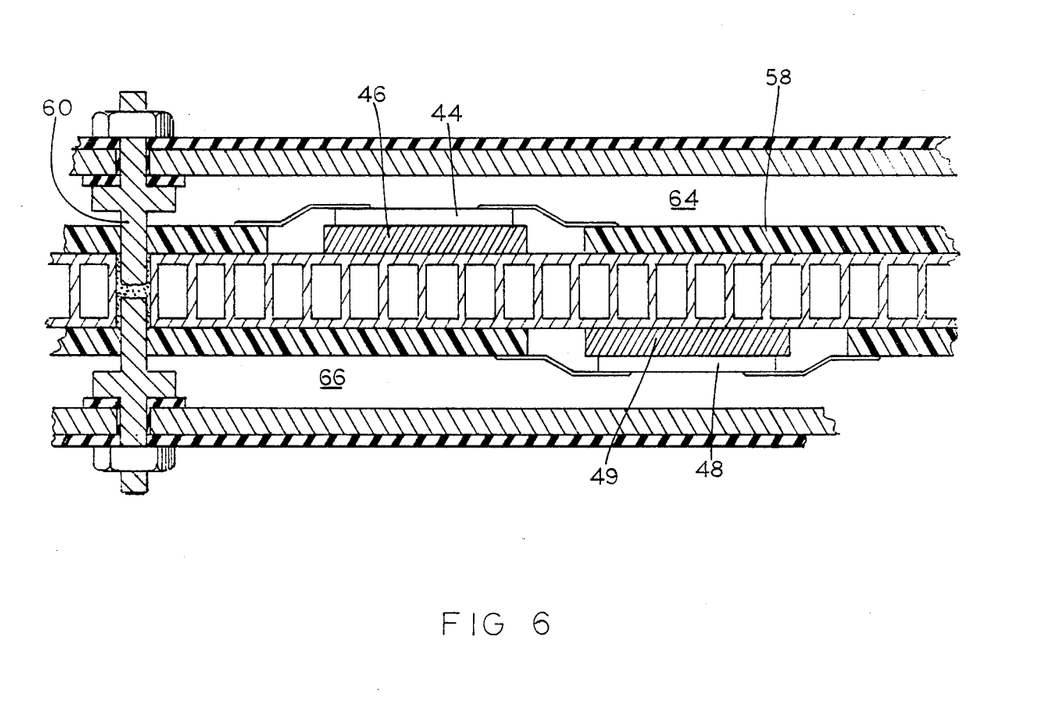
FIG. 6 is an enlarged cross section of another of my heat exchangers, showing a second arrangement for mounting semiconductor chips and a metallized substrate.

In FIG. 5 I show a chip array on one side of my novel heat exchanger 10, whereas in FIG. 6 I reveal that placement of a chip array on both sides of my heat exchanger In each of these embodiments, a suitable coolant is utilized in the heat exchanger, such as water, or a phase changing fluid such as freon. The diameter and spacing of the pins 24 can be caused to be different for each heat exchanger application. For example, in those applications requiring the fluid pressure loss of the coolant flowing through the heat exchanger be kept to a small value, the pins 24 would be caused to have a small diameter, with large spacings therebetween as suggested in FIGS. 5 and 6. In applications where the heat load is large and the chip to coolant temperature difference must be kept small, the pins 24 would be caused to have a large diameter with small spacings therebetween, as was indicated in FIGS. 3 and 4.

In the embodiment of FIG. 5, chip 30 is plated on one side with gold or some other solderable material. The chip is soldered to a chip carrier 32, which is composed of a material having a coefficient of thermal expansion sufficiently close to that of the chip material to minimize stresses in the chip resulting from temperature changes. For example, the chip carrier 32 may be molybdenum or tungsten. This chip carrier has one flat side for mounting the chip thereon, and the opposite side of the chip carrier is also flat except for a threaded stud 34 extending therefrom. By means of a nut 35, the chip carrier is drawn tightly up against the heat exchanger.

Also to be noted in FIG. 5 is a housing 28, on the exterior of which is an insulator 29. Directly below the heat exchanger 10 of FIG. 5 is a printed circuit board 38, containing printed circuitry.

It is important to note that due to its seamless construction, the heat exchanger 10 in accordance with my invention may be drilled through at the site of any one of the pins 24 in the fluid passage 12 without fear of fluid leakage. Advantageously, one pin at each desired chip site may be made larger in diameter than the surrounding pins. As will be seen in FIG. 5, the oversized pin 36 may be drilled through to accommodate the threaded stud 34 of the chip carrier. The chip carrier may thus be rigidly attached to the heat exchanger. Additionally, a thin layer of thermal grease may be used between the chip carrier 32 and the upper surface of the heat exchanger to promote good thermal contact.

The printed circuit board 38, which may be referred to as PCB, is used for routing electrical signals, and it may be attached to the side of the heat exchanger opposite that having the chips. Holes are typically drilled through the pins of the heat exchanger in the vicinity of the chip mounting site. These holes could accommodate pins or wires having insulative sleeving to prevent electrical contact with the walls of the heat exchanger. Wires 40 in FIG. 5, known as signal wires, may be very small in diameter and on the order of 0.01 inches (including the sleeving) so that a large number of chip leads can be accommodated in a small area. The chip leads 31 may be secured to the tops of the wires 40 by conventional solder bond techniques. A stud 42 illustrated in FIG. 5 may be firmly secured to the housing 28, and serve to supply current to printed circuit board 38.

A second procedure I may use for mounting chips to the heat exchanger of the present invention is depicted in FIG. 6. As in the previously described mounting technique, the chip 44 is soldered to a chip carrier 46 made of a material having substantially the same coefficient of thermal expansion as the chip material In this case, however, the chip carrier 46 is flat on both sides and lacks a threaded fastener of the type illustrated in FIG. 5. The chip carrier 46 is soldered directly to the heat exchanger surface, thus providing excellent thermal contact therebetween, while also providing the chip and its carrier a strong and rigid base. Further, a PCB having cutouts to accommodate the chips and their carriers may be attached to the same surface of the heat exchanger in any suitable fashion Electrical connection between the chip and PCB may be easily accomplished by soldering flexible leads or wires therebetween, utilizing conventional techniques.

In both mounting techniques, holes may be drilled through the pins of the heat exchanger and studs epoxied into the holes as shown in FIGS. 5 and 6. Such studs may also be soldered to the PCB and thereby used to deliver power to the array of chips. The studs may also be used as a means to fasten a protective cover to the array of chips. Still another use for such studs would be a means for fastening the heat exchanger to another structure.

It is to be noted that space 62 in FIG. 5 and spaces 64 and 66 in FIG. 6 are filled with any inert gas which does not cause chemical deterioration, corrosion, or any other such deleterious effects to the materials contained within the housing. For example, the gas utilized may be dry air, nitrogen, etc., and I prefer for the space not to contain liquids. Preferably, the gas will exist at a pressure equal to or just slightly above that of the environment outside of the housing. A slight positive pressure will ensure that any leakage will be from the housing interior to the environment there by protecting the materials inside the housing from hazardous environments. The gas pressure would not be so large as to cause the housing to deform significantly.

With regard to the wires 40 and the studs 42, these items have quite definite electrical significance in the configurations shown in FIGS. 5 and 6. The wires carry electrical signals from the chip 30 to the PCB 38, and vice versa.

The PCB 38 depicted in FIGS. 5 and 6 is meant to represent a typical multi-layered printed circuit board of either ceramic or plastic construction and having metal conductors deposited onto its various layers. Typically, the PCB function is to provide electrically conductive paths for carrying electrical signals and power to and from other chips, electrical components (resistors, capacitors, etc.), and input/output connectors (not shown in FIG. 5 or 6). The wires 40 therefore act as electrical "bridges" between chips mounted on one side of the heat exchanger and the PCB mounted on the opposite side in the case of FIG. 5. Although not shown in FIG. 6, such wires can also be installed and used to perform the same function.

It is to be noted that the wires 40 in FIG. 5 are shown enlarged with respect to the chip and other features for reasons of clarity. The wires may be as small as 0.005 inches in diameter, and the pins integral with the heat exchanger might be more closely spaced in the vicinity of the chip leads in order to accommodate large chips with a large number of leads, such as 100 or more.

It is to be realized that the studs 42 perform an equally important electrical function by providing a means for conveying electrical power from an outside source to the PCB where said power is subsequently distributed to the chips (and any other electrical devices) by means of the conductive traces on said PCB. The stud 42 is electrically insulated from, and fixed to, the heat exchanger by any suitable non-conductive adhesive. The stud is also soldered into a metal-plated hole in the PCB, thereby making good electrical contact with the conductors on the PCB. The studs have on one end a threaded nut. A wire, fixed with a common crimp-on or solder-on terminal, may be attached to said stud using the nut. The wire (not shown) could conduct electrical power to the PCB. It must be realized that this, quite clearly, is not the only way to introduce power to the PCB.

It will be noted in FIG. 5 that the chips may be mounted on one side of a heat exchanger and an accompanying PCB mounted to the opposite side of the heat exchanger, with electrical connections being made therebetween by a multiplicity of conducting pins or wires passing through said heat exchanger. Also, chips may be mounted to opposite sides of the same heat exchanger, with electrical connections being made therebetween by a multiplicity of conducting pins or wires passing through the heat exchanger.

The advantage of the packaging techniques described in FIGS. 5 and 6 takes the form of increased packaging density (i.e. decreased size) for arrays of chips, since there is no nee d for interconnect wires around the edges of the heat exchanger.

It is to be realized that the electronic packaging techniques generally described in FIGS. 5 and 6 wherein electrical connectivity between electrical components mounted on opposite sides of the novel heat exchanger is advantageously made by a multiplicity of small diameter pins or wires passing through the body of the heat exchanger, such pins or wires being insulated electrically from the heat exchanger, with the pins or wires not contacting the fluid within the heat exchanger.

Figure 7:
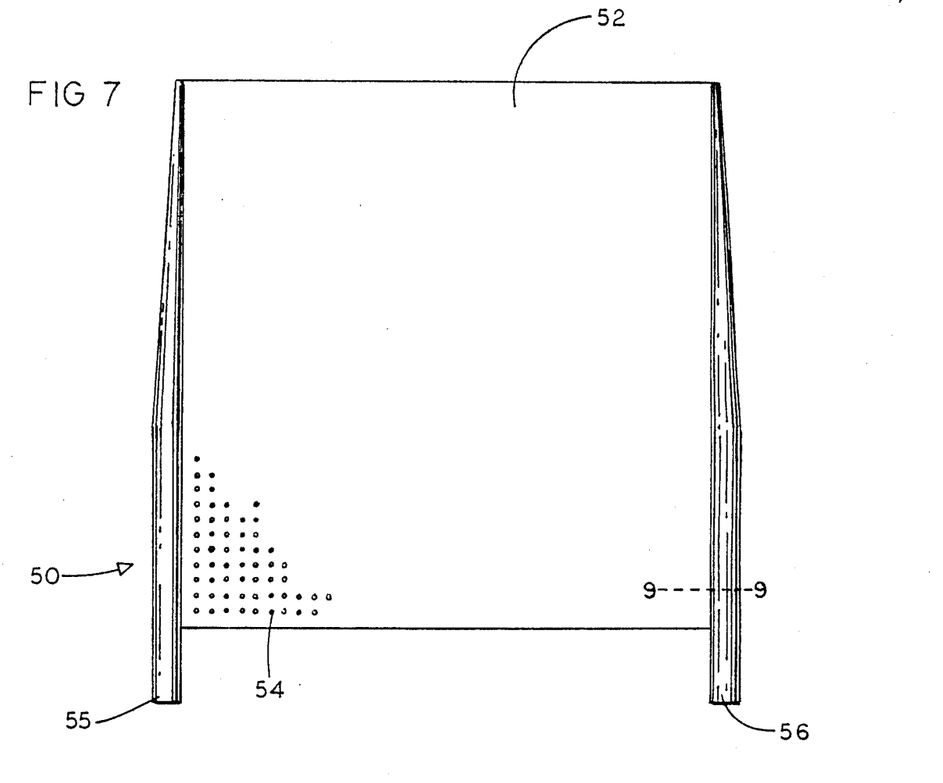
FIG. 7 is a top view of one type of mandrel from which my novel heat exchanger may be formed, with the end cylinders in this embodiment possessing some taper.
Figure 8:
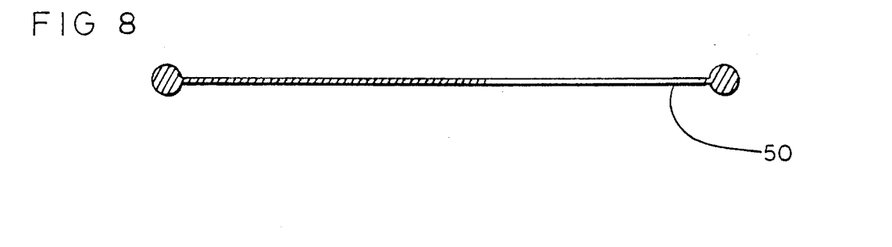
FIG. 8 is a side view of the mandrel of FIG. 7.
Figure 9:
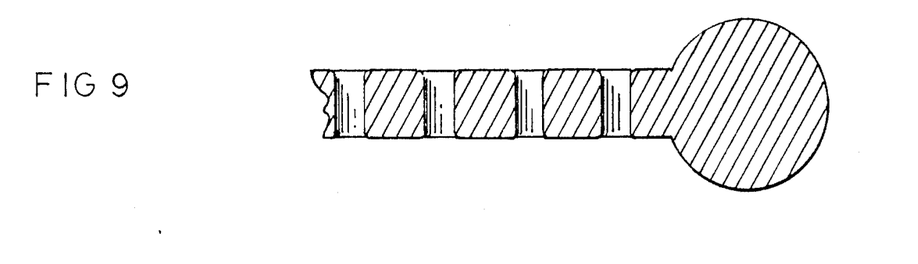
FIG. 9 is an enlarged cross section taken at 9—9 in FIG. 7.

As to a preferred way of manufacturing heat exchangers in accordance with this invention, reference is made to FIG. 7, wherein is revealed a mandrel 50 over which the shell is formed. This may take the form of a thin, flat plate 52 made of a metal such as aluminum. This plate will have the same overall dimensions as the desired internal dimensions of the fluid passage. The plate also contains holes 54 having the same spacing and diameter as the desired pin fins in the fluid cavity, as will be seen from FIG. 9. Furthermore, if the fluid manifold tubes are desired to be formed as part of the heat exchanger core, the plate will have fixed to either end a solid cylinder having the same external dimensions as the desired internal dimensions of the finished manifold. As shown in FIG. 7, solid circular cylinders 55 and 56 with a certain amount of taper are attached to the two opposing ends of the mandrel plate 52. Thus, the mandrel may be regarded as representing the "negative" geometry of the desired fluid passage in all respects.

Once the mandrel is fabricated, a shell is formed over it by one of several processes three of which are anticipated herein. First, if it is desired to have a heat exchanger made of copper or nickel, the shell may be formed by electrochemical deposition of the desired metal directly onto the surfaces and into the holes of the mandrel. This process is known as electroforming. If it is desired to have a heat exchanger made of other metals in general, the shell may be formed by another process commonly referred to as plasma spraying or arc spraying. In this latter mentioned technique, the desired metal is sprayed in very fine liquid droplet form directly onto the surfaces and into the holes of the mandrel whereupon the metal spray immediately solidifies so as not to significantly heat and warp the mandrel. Still another technique may be used to fabricate a heat exchanger made of plastic such as polybutadiene. As one example, the mandrel may be dipped into the desired liquid plastic, causing the plastic to completely coat the surfaces and fill the holes of the mandrel. The plastic coating is then allowed to cure to a hardened stage.

Regardless of the shell forming technique, the shell will completely encase the mandrel The shell material has sufficient thickness to constitute the desired wall thickness of the heat exchanger after any machining. Finally and very importantly, the shell material is applied to the mandrel in a manner sufficient to completely fill all the holes and corners in the mandrel so that there are no voids or air pockets between the surfaces of the mandrel and the material encasing it. Such void free construction yields a heat exchanger with very fine and crisp detail of the fluid passage.

Having formed the shell, the shell is machined to the final external dimensions desire d for the heat exchanger Importantly, at least one surface of the shell will be machined to expose a small portion of the mandrel encased therein. The desirable surface(s) to be cut away in order to expose the mandrel will be those where coolant fluid will normally enter and exit the heat exchanger. In the case where only a heat exchanger core without fluid manifolds is to be fabricated, the edges to be exposed will be the two ends of the fluid passage where the fluid tubes would be desirably attached. In the case where an entire heat exchanger with fluid manifold tubes is to be fabricated, the edges of the mandrel to be exposed would be the ends of the solid cylinders where fluid will flow into and out of the manifold tubes.

Having exposed a portion of the mandrel, the entire shell is immersed in a chemical which selectively dissolves the mandrel but does not damage the shell encasement. Examples of some workable material combinations include:

| Desired Heat Exchanger Material | Mandrel Material | Chemical Solvent |
|---|---|---|
| Copper | Aluminum | Hydrochloric Acid |
| Nickel | Aluminum | Hydrochloric Acid |
| Molybdenum | Aluminum | Hydrochloric Acid |
| Aluminum | Copper | Nitric Acid |
| Polybutadiene | Aluminum | Hydrochloric Acid |

With reference to FIGS. 10a through 10d, I will now proceed to explain the fabrication steps by which one of my novel heat exchangers with internal pin fins is created. These fabrication steps will further define how a seamless heat exchanger will be brought about, and also how a hole can be installed through any pin without causing fluid leakage.

For example, let it be assumed that it is desired to fabricate a heat exchanger of the preferred configuration, having dimensions typical of usage in connection with the cooling of an array of integrated circuit chips. The core of the heat exchanger, which is defined as that portion between the two fluid manifolds, is, for example, to measure 6.0 inches, by 6.0 inches by 0.07 inches thick. Further, the heat exchanger core of this preferred embodiment will have a fluid cavity 0.04 inches high.

Figure 10A:
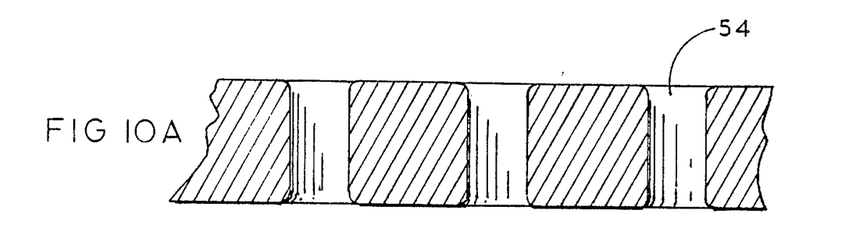
FIGS. 10A through 10D are a series of related views, with FIGS. 10B through 10D representing successive views of the gradual buildup of copper on the mandrel depicted in FIG. 10A, thus to create a heat exchanger.

As a result of the configuration of the mandrel shown in FIG. 10a, the pins 24 in the fluid cavity will have a diameter of 0.02 inches. The pin fins 24 will be uniformly spaced on 0.06 inch centers in the preferred embodiment. Fluid manifolds are to be an integral part of the heat exchanger core, that is, the manifolds are to be formed as part of the core, and the internal diameter of the fluid manifolds is preferably 0.25 inches. The heat exchanger typically is made of copper, although other materials could be utilized.

To fabricate a heat exchanger in accordance with my invention, it is typical to prepare the mandrel first The mandrel is best thought of as a disposable template from which the heat exchanger is formed. As may be seen from FIG. 10a, the typical mandrel consists of a thin plate having many small and closely spaced holes 54. In the present case, the mandrel plate will be made of aluminum, and its thickness will be the same as the height of the fluid 0.02 cavity, 0.04 inches. The holes 54 in the mandrel will be the same as the desired pin fin geometry. That is, the holes will be 0.02 inches in diameter and they will be spaced on 0.06 inch centers. As previously mentioned, solid circular cylinders with a taper are attached to two opposing ends of the mandrel plate. The diameter of each cylinder will be 0.25 inches, the same as the desired inner diameter of the fluid manifolds.

Figure 10B:
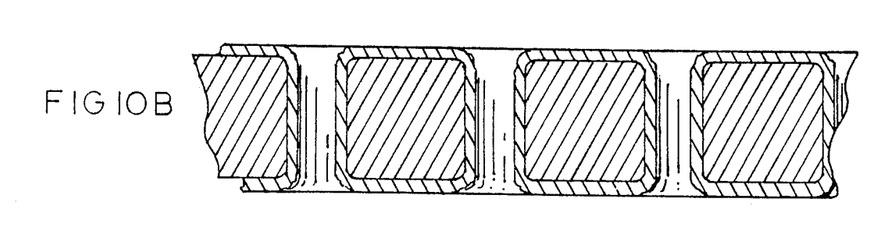
Figure 10C:
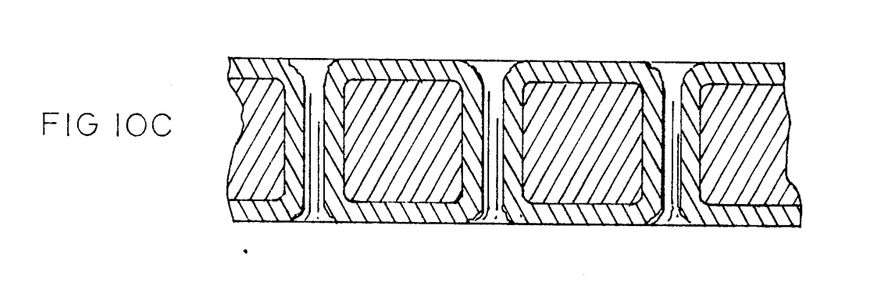
Figure 10D:
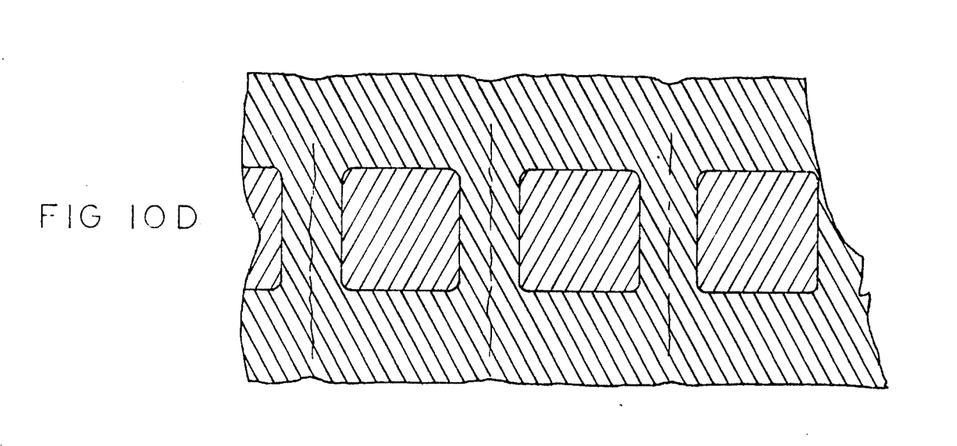

The mandrel is then placed in a copper plating solution. Referring to FIG. 10b, copper is continuously applied by electrochemical deposition to all surfaces of the mandrel including the holes through it. A sufficient amount of copper is allowed to build up on the mandrel so that copper totally fills the holes in the mandrel and also totally encases all of its surfaces including the 0.25 inch diameter cylinders. Note FIGS. 10b through 10d.

Figure 11:
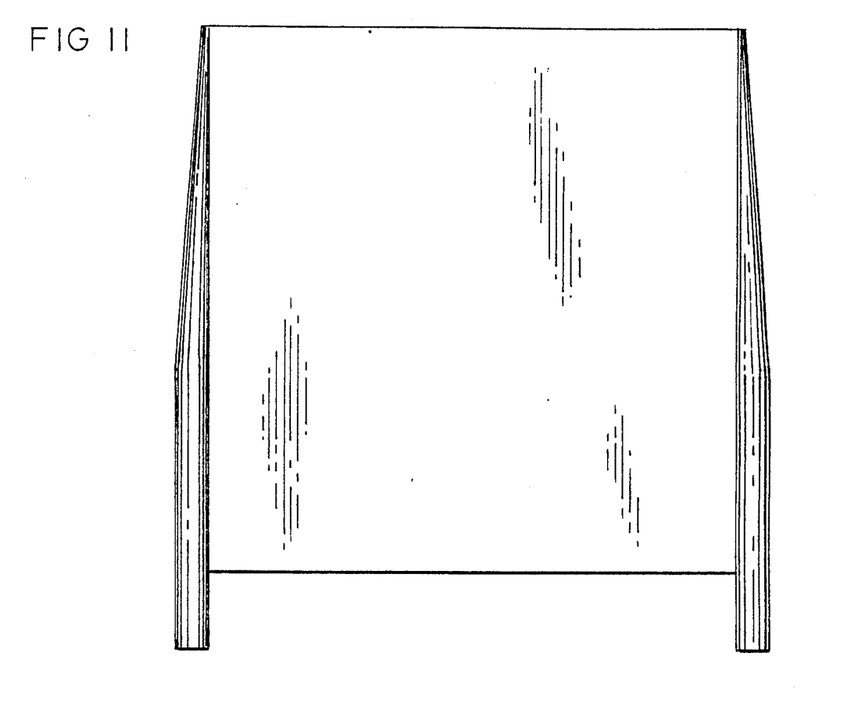
FIG. 11 is a machined part with the aluminum mandrel encased in copper.
Figure 12:
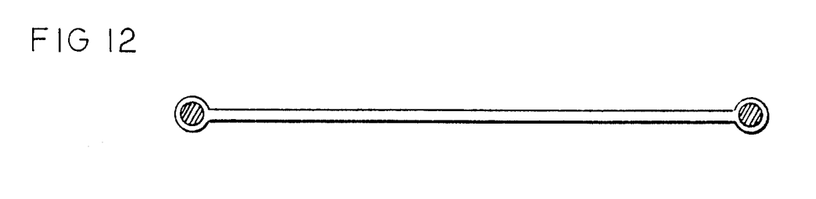
FIG. 12 is an end view of FIG. 11.
Figure 13:
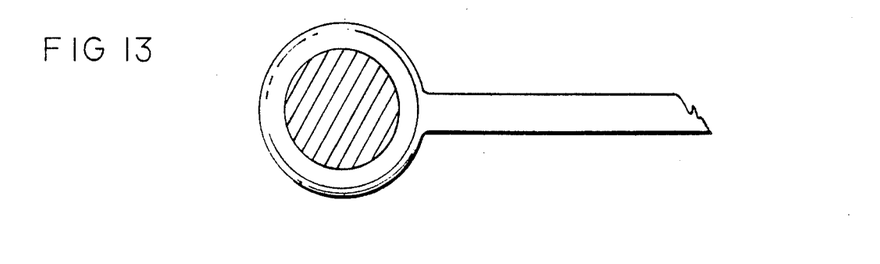
FIG. 13 is a view representing a portion of the device of FIG. 12 considerably enlarged to reveal the aluminum exposed by machining.

Referring to FIG. 11, the flat portion of the copper plated mandrel is then machined to the desired dimensions of 6.0 inches by 6.0 inches by 0.07 inches thick. This machining is performed carefully so as not to expose any of the aluminum mandrel plate. The diameter of the copper plated cylinders do not require machining unless it is an important dimension. After machining to the desired dimensions, there will be a smooth layer of copper 0.015 inches thick remaining on the surfaces of the mandrel. Importantly, the end surfaces on the plated cylinders are machined so as to expose a portion of the aluminum encased within. These two surfaces are the only exposed aluminum surfaces at this stage of fabrication.

Next, the machined part is immersed in a bath of hydrochloric acid. The acid acts selectively, for it dissolves aluminum, but does not harm copper. Upon immersion then, the acid vigorously dissolves the aluminum exposed at the machined ends of the copper plated cylinders. After a period of time, the aluminum cylinders will have been completely dissolved, thereby exposing the flat plate portion of the mandrel to the acid bath. After a further period of time all of the aluminum encased in the copper shell will have been dissolved. The copper shell which remains is the desired heat exchanger with its highly advantageous pin fin cavity.

It is important now to note that the pin fins and the adjoining walls of the heat exchanger were formed by continuous deposition of copper. The pin fins and walls are in fact "grown" as a single part without the need to braze, solder, glue, etc. Inasmuch as there never was a seam created in the copper during its fabrication, it follows that it is possible to drill completely through the heat exchanger at the site of any pin fin without breaching the fluid cavity.

After drilling any desired holes for electrical leads, etc. the surfaces of the heat exchanger core may be ground or polished for mounting integrated circuit chips.

There are other ways envisioned to form the desired heat exchanger shell over the mandrel, and I am not to be limited to the foregoing approach.

It is to be noted that there are several variations to the geometry of the heat exchanger, and such variations were omitted from the previous discussion to avoid confusion.

In some applications it is necessary to cause some of the pin fins in the fluid cavity to be at least 0.08 inches in diameter. Particularly, one such oversize pin may be necessary at each chip mounting site. As explained earlier, the oversize pin may be drilled through to accommodate a stud or screw used to hold down the integrated circuit chip carrier against the heat exchanger surface. That chip mounting technique is acceptable for chip power dissipations of less than 10 watts/cm$^2$. Higher power dissipations require the chip carrier to be soldered to the heat exchanger surface. In that case, the need for oversize pins in the sites of the chips is eliminated.

The formation of any oversize pin fin is accomplished by simply drilling a hole of the desired diameter in the aluminum mandrel plate at the desired location before the mandrel is copper plated. The oversize pin will be grown in the same manner and at the same time as the smaller pin fins.

Figure 14A:
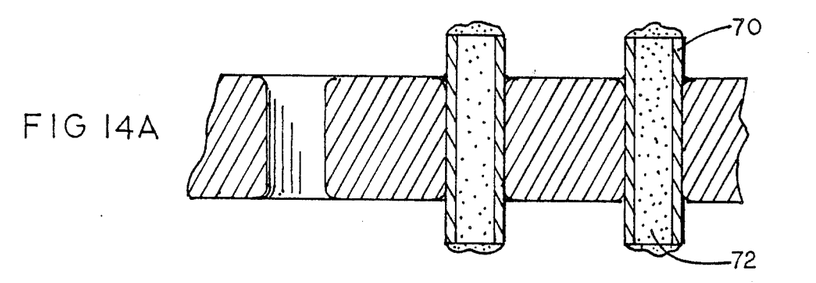
FIGS. 14A through 14D are a series of related views depicting the utilization of bushings in the creation of desired holes in the heat exchanger.

I am not to be limited to conventional machining procedures (drilling, punching, etc.) for installing holes in the heat exchanger in accordance with this invention. For example, holes through the heat exchanger may be formed in the same operation during which the heat exchanger core is formed. With reference now to FIGS. 14A through 14D, it is to be noted that first, a plurality of thin-walled, hollow cylindrical bushings may be installed into the mandrel (prior to any material deposition) at those locations where through holes are desired. A typical bushing 70 is illustrated in FIG. 14A.

Importantly, each bushing utilized in the mandrel has the same inner diameter as the desired hole diameter, a wall thickness appropriate for the structural loads imposed by the particular application, and a length which is at least as long as the desired heat exchanger overall thickness Each bushing 70 is made of a suitable material which will not be adversely affected by subsequent fabrication processes (chemical removal of mandrel) or by the coolant fluid, and which will serve as an appropriate base to which the heat exchanger material may be deposited. For metal heat exchangers, it is preferred the bushing be of the same material as the heat exchanger For plastic heat exchangers, it is preferred the bushing be of any metal which meets the aforementioned requirements.

Figure 14B:
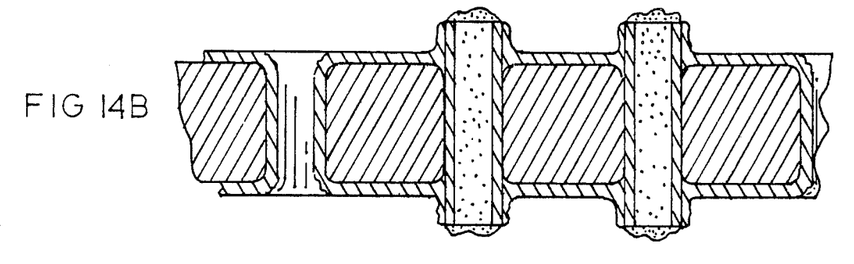
Figure 14C:
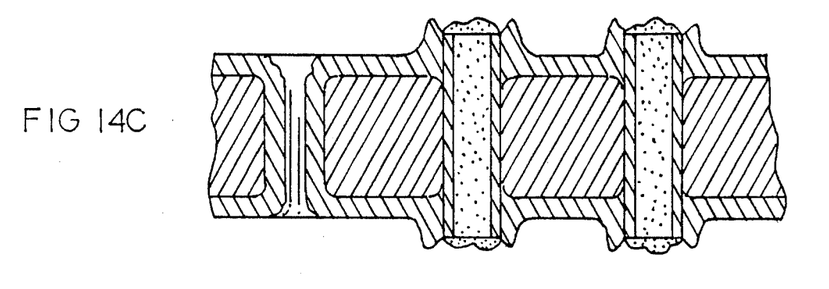
Figure 14D:
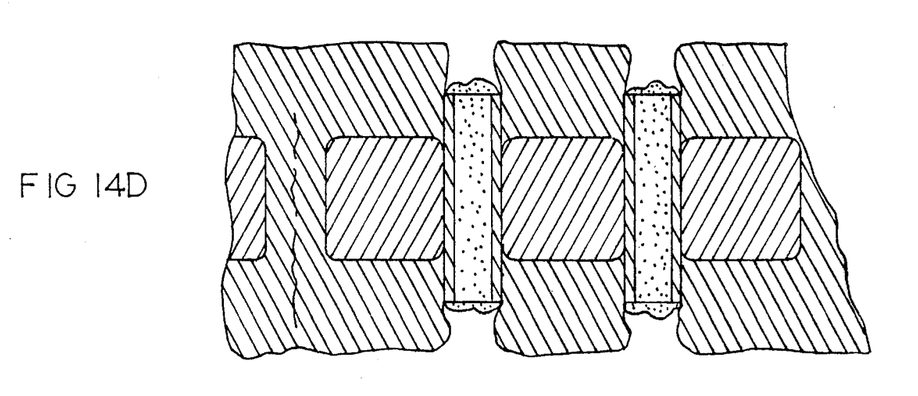

After the desired number of bushings have been installed in the mandrel, the bore of each bushing is completely filled with a suitable maskant 72 which will prohibit material from being deposited therein during subsequent fabrication processes. Having been thus prepared with bushings, the mandrel is plated or sprayed with the desired heat exchanger material as described previously. During this process, material is deposited onto those outer walls of the bushing which extend beyond the mandrel, as depicted in FIGS. 14B through 14D. This material deposition permanently seals the bushing into the heat exchanger to eliminate possibility of fluid leaks from the coolant channel. The part is machined to its final dimensions. The mandrel is dissolved and the maskant is removed from the bushings, thereby exposing holes through the heat exchanger.

A heat exchanger of the present invention is uniquely advantageous for cooling integrated circuit chips having very high heat dissipations per unit surface area. The advantages of the heat exchanger over that of the prior art are summarized below.

1. The heat exchanger has a low thermal resistance between the chips and the coolant. This is due to
    (a) a large number of small diameter pins in the fluid passage which causes turbulence and substantially interrupts the formation of fluid boundary layers.
    (b) the close proximity of coolant to substantially all of the surfaces to which chips would be mounted.
    (c) high conductivity of the heat exchanger material in the case of metal construction.
2. The heat exchanger is capable of significant internal fluid pressures without substantial distortion of the surfaces to which chips would be mounted.
3. The heat exchanger is very compact and lightweight yet capable of cooling a large array of chips.
4. The heat exchanger is free of seams requiring soldering, welding, gluing, gasketing or other means of joining. This characteristic is highly advantageous because it virtually eliminates the possibility of fluid leakage.
5. The heat exchanger may contain holes through it in any number of locations without fear of causing a fluid leak. Such holes are advantageous for routing electrical conductors and for mechanical fastening.
6. It is relatively easy to mount the chips in a manner which
    (a) secures the chip against damage
    (b) allows access to the chip for repair or replacement
    (c) accommodates differences in the rates of thermal expansion between the chip and the heat exchanger.

I claim:

1. A one-piece, substantially flat and very thin metal heat exchanger core having two flat and parallel surfaces, each of said surfaces being suitable as a mounting surface for a number of heat producing electronic chips, said surfaces being closely spaced and separated by a single cavity for conveying a fluid coolant, said cavity containing a plurality of closely spaced, generally circular pins extending the full distance between said parallel surfaces, said pins being permanently and integrally formed as part of said parallel surfaces without creation of a seam, said pins being capable of having a hole installed through for their entire length, from one of said surfaces to the other, without breaching said fluid cavity and without creating a path for fluid to leak from said fluid cavity to the ambient, the majority of said pins being no more than 0.035 inches in diameter, said core having a total cross-sectional thickness of approximately 0.04 inches.

2. A one-piece, substantially flat and very thin heat exchanger core having two flat and parallel surfaces, each of said surfaces being suitable as a mounting surface for a number of heat producing electronic chips, said surfaces being closely spaced and separated by a single cavity for conveying a fluid coolant, said cavity containing a plurality of closely spaced pins extending the full distance between said parallel surfaces, said pins being formed and permanently joined to both of said parallel surfaces without creation of a seam, said pins being capable of having a hole installed through for their entire length, from one of said surfaces to the other, without breaching said fluid cavity and without creating a path for fluid to leak from said fluid cavity to the ambient, at least one electronic chip being mounted on one of said flat surfaces of said heat exchanger, and an accompanying printed circuit board being mounted to the other of said flat surfaces, with electrical connections being made between said chip and said printed circuit board by a multiplicity of conducting components extending through at least one of said pins.

3. A one-piece, substantially flat and very thin heat exchanger core having two flat and parallel surfaces, each of said surfaces being suitable as a mounting surface for a number of heat producing electronic chips, said surfaces being closely spaced and separated by a single cavity for conveying a fluid coolant, said cavity containing a plurality of closely spaced pins extending the full distance between said parallel surfaces, said pins being formed and permanently joined to both of said parallel surfaces without creation of a seam, said pins being capable of having a hole installed through for their entire length from one of said surfaces to the other, without breaching said fluid cavity and without creating a path for fluid to leak from said fluid cavity to the ambient, at least one chip being mounted on each of said flat surfaces of said heat exchanged, with electrical connections being made between said chips by a multiplicity of conducting components extending through at least one of said pins.

4. A one-piece heat exchanger core as defined in claim 1 in which fluid manifold tubes are a part of said heat exchanger core with no seam therebetween, and connected to said cavity, whereby a fluid coolant can be caused to circulate through said cavity, in order to cool said surfaces.

5. A method for creating a one-piece, very thin, substantially flat heat exchanger core having two flat and parallel surfaces, with each of said surfaces being suitable as a mounting surface for a number of heat producing electronic chips, said surfaces being closely spaced and separated by a single cavity for conveying a fluid coolant, and with said cavity containing a substantial number of seamless pins extending the full distance between said parallel surfaces, said method involving the steps of creating a mandrel having a pair of flat and parallel surfaces, with a substantial number of holes extending between said surfaces, applying metal to said mandrel surfaces and into the holes of said mandrel to such an extent as to completely encase said mandrel with a shell, machining said shell to the final dimensions desired for the heat exchanger core, exposing said mandrel at least at one location on said shell, and then removing said mandrel from the interior of said shell by a chemical etching process.

6. The method for creating a one-piece, very thin, substantially flat heat exchanger core as defined in claim 5 in which metal is applied to said mandrel by spraying liquid droplets.

7. The method for creating a one-piece, very thin, substantially flat heat exchanger core as defined in claim 5 in which the mandrel is made of aluminum, and it is removed from the interior of said shell by immersing said shell in hydrochloric acid.

8. The method for creating a one-piece, very thin, substantially flat heat exchanger core as defined in claim 5 in which the mandrel is made of copper, and it is removed from the interior of said shell by immersing said shell in nitric acid.

9. A method for creating a one-piece, very thin, substantially flat heat exchanger core having two flat and parallel surfaces, with each of said surfaces being suitable as a mounting surface for a number of heat producing electronic chips, said surfaces being closely spaced and separated by a single cavity for conveying a fluid coolant, and with said cavity containing a substantial number of pins extending the full distance between said parallel surfaces, at least one of said pins possessing a hole extending the full distance between said surfaces, said method involving the steps of creating a mandrel having a pair of flat and parallel surfaces, with a substantial number of holes extending between said surfaces, installing into the mandrel one or more hollow metal bushings with maskant therein, applying metal to said mandrel surfaces and to said bushings and into the holes of said mandrel to such an extent as to completely encase said mandrel with a shell, machining said shell to the final dimensions desired for the, heat exchanger core, exposing said mandrel at least at one location on said shell, and then removing said mandrel from the interior of said shell by a chemical etching process.

10. The method for creating a one-piece, very thin, substantially flat heat exchanger core as defined in claim 9 in which the mandrel is made of aluminum, and it is removed from the interior of said shell by immersing said shell in hydrochloric acid.

11. The method for creating a one-piece, very thin, substantially flat heat exchanger core as defined in claim 9 in which the mandrel is made of copper, and it is removed from the interior of said shell by immersing said shell in nitric acid.

* * * * *

UNITED STATES PATENT OFFICE
CERTIFICATE OF CORRECTION

Patent No. 4,938,280          Dated July 3, 1990

Inventor(s)  William E. Clark

It is certified that error appears in the above-identified patent and that said Letters Patent is hereby corrected as shown below:

On the title page, in item [57] ABSTRACT, line 11 "...accomplished with..." should read --...accomplished without...--.

In Column 11, line 54, "...fluid 0.02 cavity, 0.04 inches." should read --...fluid cavity, 0.04 inches.--

Signed and Sealed this

Fifteenth Day of October, 1991

*Attest:*

HARRY F. MANBECK, JR.

*Attesting Officer*     *Commissioner of Patents and Trademarks*